United States Patent [19]

Ainslie et al.

[11] Patent Number: 4,534,811
[45] Date of Patent: Aug. 13, 1985

[54] APPARATUS FOR THERMO BONDING SURFACES

[75] Inventors: Norman G. Ainslie, Croton-on-Hudson; Swie-In Tan, Bedford Hills, both of N.Y.

[73] Assignee: International Business Machines Corporation, Armonk, N.Y.

[21] Appl. No.: 567,219

[22] Filed: Dec. 30, 1983

[51] Int. Cl.³ .................. B23K 9/04; B23K 26/00; B29C 27/08
[52] U.S. Cl. .................. 156/73.1; 156/272.8; 156/379.6; 156/580.1; 156/583.1; 219/56.1; 219/56.22; 219/121 L; 219/121 LC; 219/121 LD; 219/121 LM; 219/243; 228/110; 228/242; 228/904; 228/1.1
[58] Field of Search .......... 156/73.1, 272.8, 379.6, 156/580.1, 583.1; 228/110, 1 R, 242, 1 A, 904; 219/56.1, 56.22, 243, 121 L, 121 LM, 121 LE, 121 LF, 258, 121 LC, 121 LD

[56] References Cited

U.S. PATENT DOCUMENTS

| 3,304,403 | 2/1967  | Harper ............... 219/121 L |
| 3,382,343 | 5/1968  | Muncheryan ......... 219/121 L |
| 3,404,350 | 10/1968 | Muncheryan ......... 219/121 L |
| 3,509,317 | 4/1970  | Valsamakis et al. ..... 219/258 |
| 3,608,809 | 9/1971  | Cushman ............ 156/73.1 |
| 3,617,683 | 11/1971 | Beresford ........... 219/121 L |
| 3,747,198 | 7/1973  | Benson et al. ........ 228/1 R |
| 3,986,767 | 10/1976 | Rexer et al. ......... 219/121 L |
| 3,997,385 | 12/1976 | Osborne ............. 156/272.8 |
| 4,320,281 | 3/1982  | Cruickshank et al. ... 219/121 LD |

Primary Examiner—Michael Wityshyn
Attorney, Agent, or Firm—Pollock, Vande Sande & Priddy

[57] ABSTRACT

Apparatus and method for bonding surfaces together. A laser beam is applied to the opening in a bonding tip. The bonding tip includes a central cavity forming a black body tapered from the opening to a second tip end. The heated tip end is applied to the fuseable surfaces in either a thermocompression or thermosonic bonding operation.

6 Claims, 1 Drawing Figure

APPARATUS FOR THERMO BONDING SURFACES

The present invention relates to the thermosonic and thermocompression bonding art. Specifically, apparatus for converting laser beam energy into a bonding heat is described.

Thermocompression and thermosonic bonding have been used in the past to join electronic circuit package contact pads with fine wires or ribbons. Each of these techniques generates heat and applies the heat to the surfaces to be bonded under pressure or with ultrasonic energy added to the surfaces to be joined.

The heat generation technique utilized in these processes typically uses a bonding tip heated through an electrical current applied at one end. The resistive heating of the bonding tip requires sufficient time for the heat to travel down the bonding tip shank to the end of the tip which contacts the joint to be bonded. The elapsed time between the application of a heat generation current and a temperature rise at the joint is in the order of 0.5 to to three seconds. This time lapse renders the bonding operation too slow for high volume circuit production. Further, much of the generated heat is lost to radiation, reducing the bonding temperature at the joint.

Other bonding techniques are exemplified in U.S. Pat. No. 4,320,281 which demonstrates the use of laser beam energy to heat the joint surfaces. This technique has not been satisfactory due in part to surface irregularities which result in differences in reflectivity. The heating which results is uneven and the bonding temperature is largely uncontrollable.

SUMMARY OF THE INVENTION

It is an object of this invention to generate a controllable bonding temperature for joining metallic or non-metallic surfaces.

It is a specific object of this invention to generate a bonding temperature from a laser beam for thermocompression, ultrasonic and thermosonic bonding applications.

These and other objects are provided by an apparatus and method in accordance with the invention. A laser beam is used as a source of heat generation. A bonding tip is provided with a black body cavity for receiving the laser beam. The black body cavity provides for total absorption of the laser beam, thus heating the bonding tip in a region adjacent the materials to be bonded.

In a preferred embodiment, a bonding tip having a conical taper is provided. The cavity formed in the body also exhibits a conical taper in the direction of the joint to be bonded. The incident laser beam is propagated between surfaces of the cavity towards the joint, resulting in a temperature rise at the end of the tip which is in contact with the surfaces of the joint.

DESCRIPTION OF THE PREFERRED EMBODIMENT

Figure 1:
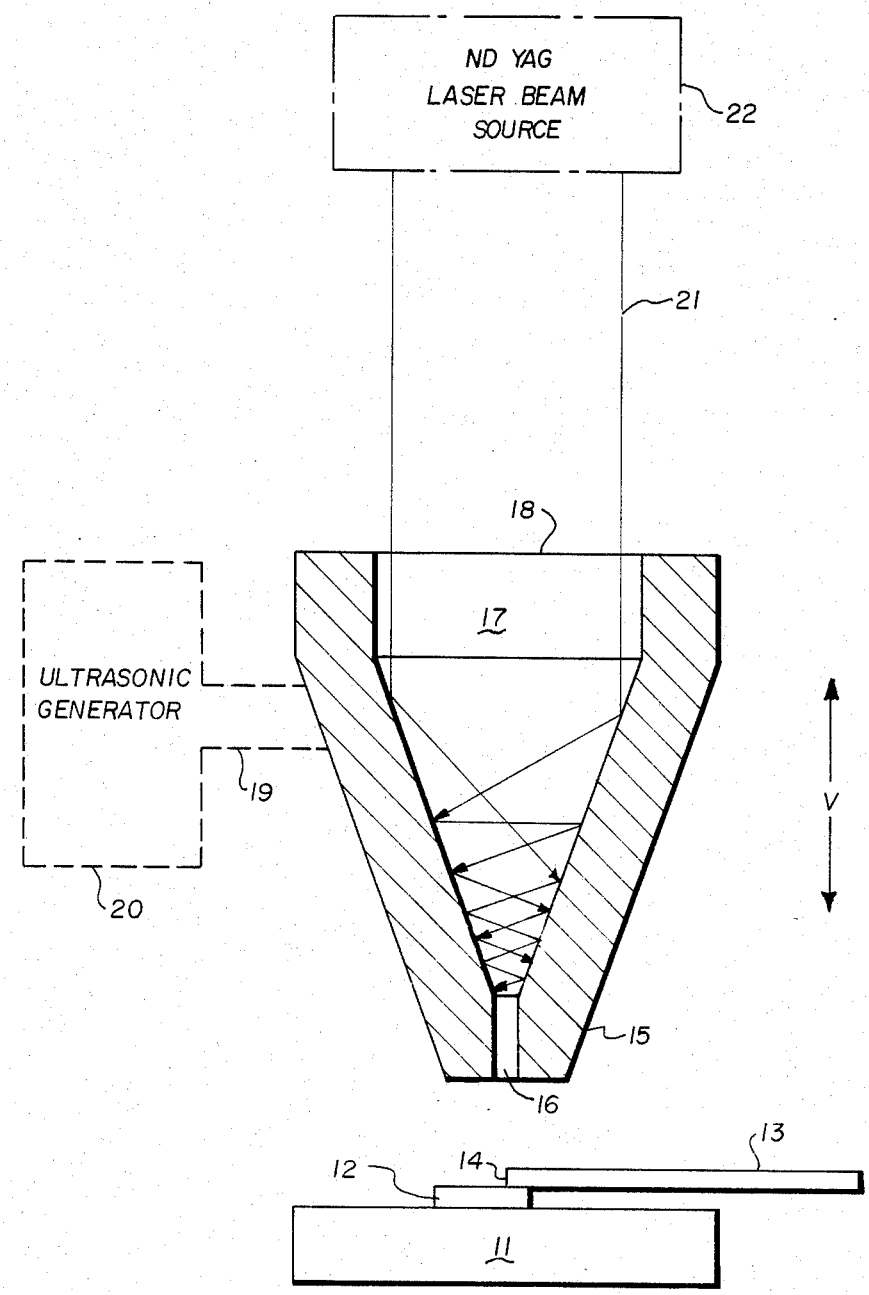
FIG. 1 is an illustration of a preferred embodiment of the invention.

Referring now to FIG. 1, there is shown an apparatus for carrying out the invention. The apparatus provides for thermosonic or thermocompression bonding of a metallic joint.

The heat energy necessary to bond two elements 12, 13 together is supplied by a laser source 22. The laser source can be any high power pulsed or continuous wave (CW) laser, such as NdYAG, Ar-ion, $CO_2$, Cu vapor, etc. The power required to obtain the required tip heating is typically 1–10 watts of average power. For example, a 1 msec, 1000 watt pulse every second would be equivalent to 1 watt of CW operation. A specific example used is NdYAG pulsed laser output of one joule/pulse, (pulse width of 1–5 msec, pulse height of 1000–200 watts) firing every second.

A tungsten capillary tip 15 is shown having a central bore 17. The bore 17 is tapered from a larger entrance aperture 18 to an optional exit bore 16. The tip end or exit bore 16 is located over a joint 14 to be bonded. One element of the joint 14 is shown as a contact pad 12 on an integrated circuit 11, and the remaining element is a wire connection 13.

The tip portion 16 is moved the vertical distance V into contact with the joint 14. In a thermocompression mode of operation, the joint 14 is placed under pressure by the tip portion 16 while heat is applied to the joint 14. The heat energy necessary to bond elements 13 and 14 together is generated by a black body cone formed by the tapered portion of central bore 17. The black body wedge internally absorbs all of the incident laser beam 21 energy, raising the temperature of the tip portion 16.

The apparatus of FIG. 1 is also adaptable to ultrasonic and thermosonic bonding. An ultrasonic generator 16 is connected through linkage 19 to impart ultrasonic energy to the tungsten capillary tip 15 in a horizontal plane.

The tungsten capillary tip 15 may be of the type manufactured by Hughes Aircraft Company under the number EBB-1-15. The central bore 17 is tapered at an angle sufficiently acute to absorb all the energy of the incident laser beam in the region of tip 16.

The apparatus and method of FIG. 1 provides a bonding temperature at tip 16 of 1250° C. within 3 milliseconds, and a thermal decay time on the order of 10 milliseconds, a considerable improvement over the prior art current discharge technique for generating bonding tip temperatures. The uncontrollable losses attendant with laser techniques which directly apply laser energy to the joint 14 are avoided by the black body cone which absorbs the energy before applying the same to the joint 14.

Thus, there has been described an apparatus and method in accordance with one embodiment of the invention for generating a bonding tip temperature for use in thermocompression, ultrasonic and thermosonic processes. Those skilled in the art will recognize yet other embodiments within the scope of the claims which follow.

What is claimed is:

1. A bonding apparatus for bonding circuit elements together comprising:
    a laser generator for producing a laser beam;
    a bonding tip having one end open to receive said laser beam, said bonding tip having an interior wall surface conically tapered from said one open end to an opposite heating end, an interior generally conical taper of said tip forming a black body cavity whereby said laser beam energy is absorbed by black body absorption to heat said tip; and
    means for adding ultrasonic bonding energy to said tip whereby said tip, when applied to surfaces to be joined together, results in said sufaces being bonded.

2. A method for bonding surfaces to be joined together comprising:
applying a laser beam to the interior cavity of a bonding tip, said interior cavity forming a black body cavity, tapered from a first end to a second tip end, whereby said laser beam energy is dissipated through black body absorption to generate heat; and
applying an ultrasonic vibrating force to said tip whereby said tip when applied to said surfaces, produces bonding of said surfaces.

3. The apparatus of claim 1 wherein said laser beam is pulsed.

4. The apparatus of claim 3 wherein said laser beam pulse has a width between 0.5 milliseconds and 1 nanosecond.

5. An apparatus for thermocompression bonding comprising:
a source of laser energy; and
a bonding tip having a central cavity conically tapered from an open end towards an oppositely disposed heating end, said central cavity forming a black body interior cavity whereby incident laser beam energy is absorbed in said black body interior cavity raising its temperature thereof while propagating towards said heating end.

6. An apparatus for generating heat sufficient for bonding metallic elements comprising:
a bonding tip having a tapered cavity open at one end;
said cavity being tapered to propagate a laser beam incident to said one end, said cavity forming a black body cavity which absorbs said laser beam energy producing heat; and
a source of laser beam energy directed to illuminate said one end with laser beam energy.

* * * * *